(12) United States Patent
Yen et al.

(10) Patent No.: US 11,646,381 B2
(45) Date of Patent: May 9, 2023

(54) METHOD FOR MANUFACTURING NON-VOLATILE MEMORY DEVICE (71) Applicant: Powerchip Semiconductor Manufacturing Corporation, Hsinchu (TW)

(72) Inventors: Shiangshiou Yen, Taipei (TW); Bo-An Tsai, Hsinchu (TW)

(73) Assignee: Powerchip Semiconductor Manufacturing Corporation, Hsinchu (TW)

(*) Notice: Subject to any disclaimer, the term of this patent is extended or adjusted under 35 U.S.C. 154(b) by 0 days.

(21) Appl. No.: 17/844,745

(22) Filed: Jun. 21, 2022

(65) Prior Publication Data

US 2022/0320341 A1 Oct. 6, 2022

Related U.S. Application Data (62) Division of application No. 17/144,101, filed on Jan. 7, 2021, now Pat. No. 11,424,370.

(30) Foreign Application Priority Data

Nov. 23, 2020 (TW) .................. 109140994

(51) Int. Cl.
*H01L 29/788* (2006.01)
*H01L 23/522* (2006.01)
*H01L 29/66* (2006.01)
*H01L 21/28* (2006.01)
*H01L 29/423* (2006.01)

(52) U.S. Cl.
CPC ...... *H01L 29/7881* (2013.01); *H01L 23/5226* (2013.01); *H01L 29/40114* (2019.08); *H01L 29/42328* (2013.01); *H01L 29/66825* (2013.01)

(58) Field of Classification Search
CPC .......... H01L 29/7881; H01L 29/40114; H01L 29/5226
See application file for complete search history.

(56) References Cited

U.S. PATENT DOCUMENTS

| 6,806,529 B1 * | 10/2004 | Hopper ............. H01L 29/40114 438/257 |
| 2004/0113198 A1 * | 6/2004 | Mitros ................... H10B 41/30 257/E21.422 |
| 2008/0135904 A1 * | 6/2008 | Roizin ............... G11C 16/0416 257/E29.345 |

* cited by examiner

*Primary Examiner* — Errol V Fernandes
(74) *Attorney, Agent, or Firm* — JCIPRNET (57) ABSTRACT A method for manufacturing a non-volatile memory device includes forming a device isolation structure in a substrate, forming a floating gate, an inner layer dielectric (ILD) layer, and a floating gate contact on the substrate, and forming an interconnect structure on the ILD layer. The interconnect structure includes alternately stacked metal layers and inter metal dielectric (IMD) layers and vias connecting the upper and lower metal layers. In the method, after the ILD layer is formed, first and second comb-shaped contacts are simultaneously formed in at least one of the ILD layer and the IMD layers above the device isolation structure, wherein the first comb-shaped contact is a floating gate extension part, and the second comb-shaped contact is a control gate. During the forming of the interconnect structure, a structure is simultaneously formed for electrically connecting the floating gate extension part to the floating gate contact.

5 Claims, 10 Drawing Sheets

METHOD FOR MANUFACTURING NON-VOLATILE MEMORY DEVICE

CROSS-REFERENCE TO RELATED APPLICATION

This application is a divisional application of and claims the priority benefit of U.S. patent application Ser. No. 17/144,101, filed on Jan. 7, 2021, now allowed. The prior application Ser. No. 17/144,101 claims the priority benefit of Taiwan application serial no. 109140994, filed on Nov. 23, 2020. The entirety of each of the above-mentioned patent applications is hereby incorporated by reference herein and made a part of this specification.

BACKGROUND OF THE INVENTION

Field of the Invention

The invention relates to a non-volatile memory technique, and particularly relates to a non-volatile memory device and a method for manufacturing the same.

Description of Related Art

A non-volatile memory device may perform multiple data operation s storing, reading, and erasing, and has advantages such as the stored data does not disappear when the power supply is interrupted, short data access time, and low power consumption, and therefore has currently become a memory device widely used in various electronic products. However, multiple-time programmable (MTP) memory devices have become one of the focuses of current research because they may change their access state many times.

In order to cope with the miniaturization of device size, several new types of MTP memory devices have been developed. For example, according to the device design, the voltage coupling ratio between the floating gate and the control gate is increased to improve the programming/erasing efficiency of the memory device.

However, because the way to increase the voltage coupling ratio between the floating gate and the control gate is mostly to increase the coupling area between the floating gate and the control gate, a large area plasma etching process is often needed to produce the desired circuit pattern. The plasma itself has high-energy particles and charged ion electrons, thus affecting the reliability of the memory device. For example, a memory device with a metal-oxide-metal (MOM) capacitor structure has a large area of metal circuits connected to the floating gate. Therefore, during the plasma etching of the metal circuits, a large amount of charges is accumulated on the floating gate, causing the so-called antenna effect and damaging the gate oxide layer. As a result, the issues of product yield reduction and reliability degradation occur. When the size of the device and the thickness of the gate oxide layer are smaller, the above issues are more significant.

SUMMARY OF THE INVENTION

The invention provides a method for manufacturing a non-volatile memory device that may solve the issues of product yield reduction and reliability degradation caused by an antenna effect.

The method for manufacturing a non-volatile memory device of the invention includes forming a device isolation structure defining an active area in a substrate; forming a floating gate on the substrate in the active area; forming an inner layer dielectric (ILD) layer on the substrate to cover the floating gate and the device isolation structure; forming a floating gate contact in the ILD layer to contact the floating gate; and forming an interconnect structure on the ILD layer, wherein the interconnect structure includes a plurality of metal layers and a plurality of inter metal dielectric (IMD) layers that are alternately stacked and a plurality of vias connecting upper and lower metal layers. In the manufacturing method: after the ILD layer is formed, in at least one of the ILD layer and the MAD layers above the device isolation structure, a first comb-shaped contact is formed as a floating gate extension part and a second comb-shaped contact is formed as a control gate simultaneously; and during the forming of the interconnect structure, a structure for electrically connecting the floating gate extension part to the floating gate contact is simultaneously formed.

In an embodiment of the invention, the first comb-shaped contact and the second comb-shaped contact are formed simultaneously with the floating gate contact.

In an embodiment of the invention, the first comb-shaped contact and the second comb-shaped contact are formed simultaneously with at least one of the plurality of vias.

In an embodiment of the invention, the manufacturing method may further include forming a first comb-shaped metal structure and a second comb-shaped metal structure in at least one of the IMD layers, and forming a structure electrically connected to the floating gate extension part and the first comb-shaped metal structure and forming a structure electrically connected to the control gate and the second comb-shaped metal structure during the forming of the interconnect structure.

In an embodiment of the invention, the step of forming the floating gate may further include: forming a select gate disposed in parallel with the floating gate in the active area, wherein the select gate is an N-type or P-type metal oxide semiconductor-transistor only used in a memory circuit to select a gate of an auxiliary transistor of a memory cell to be erased, read, or programmed.

Based on the above, in the invention, a comb-shaped contact is used as a floating gate extension part and another comb-shaped contact is used as a control gate. Therefore, the voltage coupling ratio between the floating gate and the control gate may be greatly improved, thereby improving the programming/erasing efficiency of the device. Moreover, during the manufacture of the comb-shaped contact, because the comb-shaped contact is located above the device isolation structure and electrically connected to the floating gate via a metal layer with a higher level than the first comb-shaped contact and the second comb-shaped contact, the gate insulating layer under the floating gate is not damaged due to the antenna effect, thereby improving the yield and reliability of subsequent products.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1E are diagrams of a manufacturing process of a non-volatile memory device according to the first embodiment of the invention.

Figure 1A:
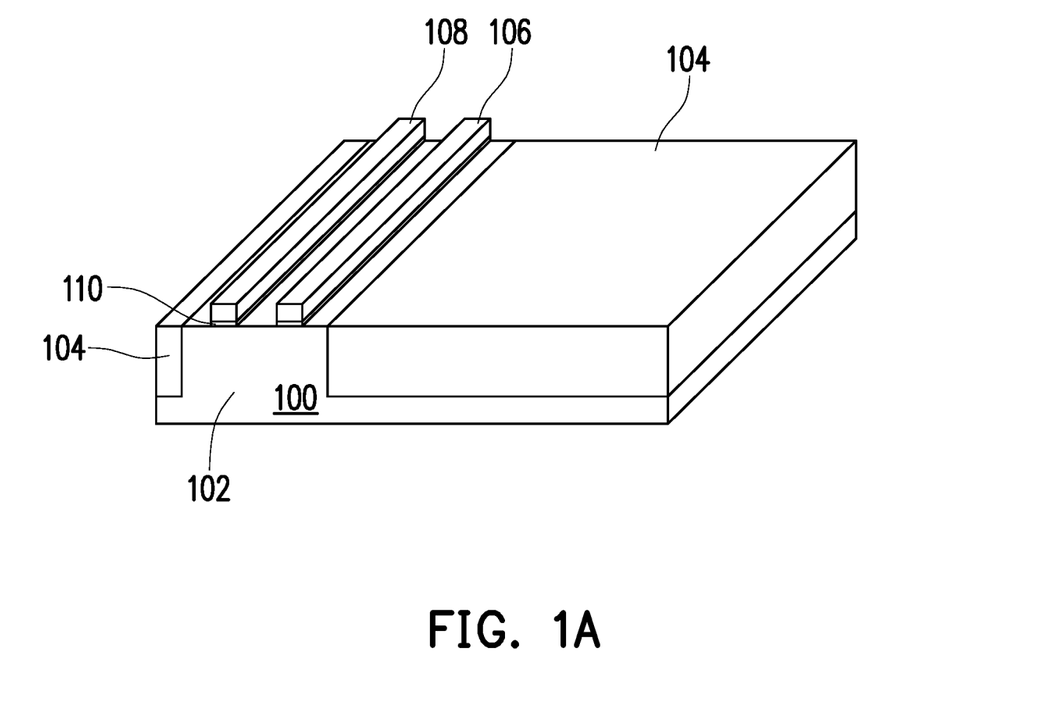
FIG. 1A to FIG. 1E are diagrams of a manufacturing process of a non-volatile memory device according to the first embodiment of the invention.

Please refer to FIG. 1A first, a device isolation structure 104 defining an active area 102 is formed in a substrate 100. Then, a floating gate 106 is formed on the substrate 100 in the active area 102. The process thereof may be, for example, first depositing a polysilicon layer (not shown) on the surface of the substrate 100, and then patterning the polysilicon layer by photolithography to obtain the floating gate 106. Moreover, during the forming of the floating gate 106, a select gate 108 disposed in parallel with the floating gate 106 may be formed in the active area 102 according to the device design. The manufacturing process thereof is the same as that of the floating gate 106. The select gate 108 is a metal oxide semiconductor-transistor (can be N-type or P-type), and in a memory circuit, this transistor is only used to select a gate of an auxiliary transistor of a memory cell to be read, erased, or programmed. In addition, a gate insulating layer 110 is usually formed before the floating gate 106/the select gate 108 is formed.

Figure 1B:
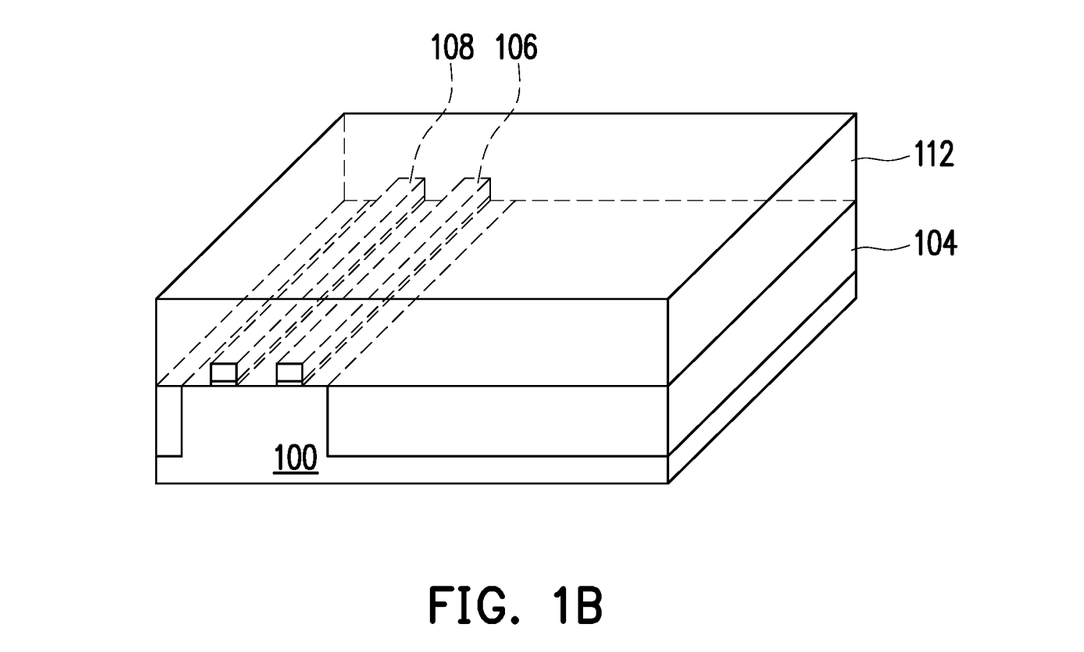

Next, referring to FIG. 1B, an inner layer dielectric (ILD) layer 112 is formed on the substrate 100 to cover the floating gate 106/the select gate 108 and the device isolation structure 104.

Figure 1C:
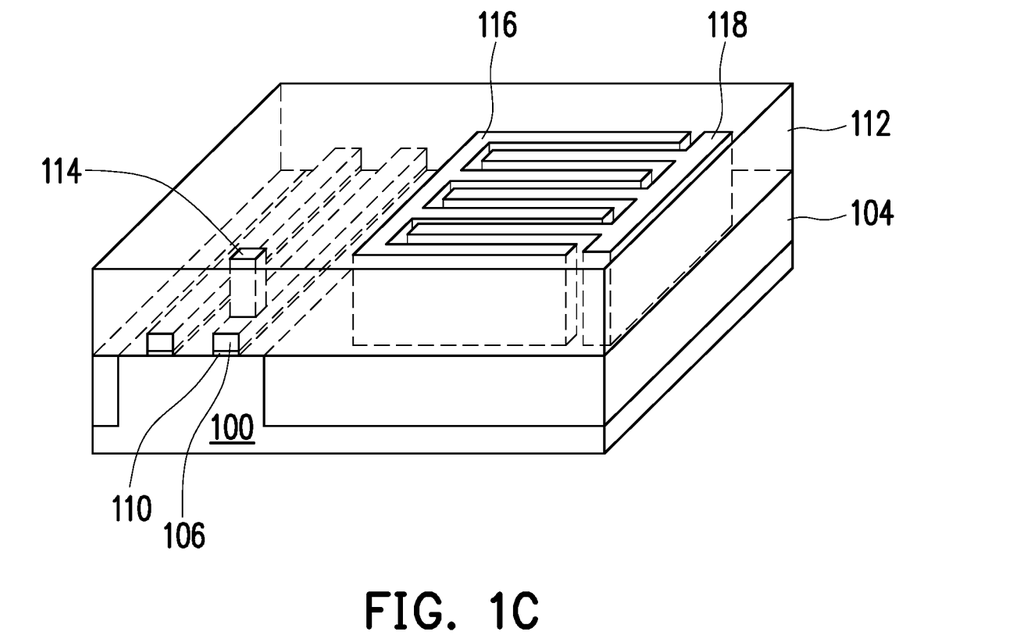

Then, referring to FIG. 1C, a floating gate contact 114 is formed in the ILD layer 112 to contact the floating gate 106, and a first comb-shaped contact 116 and a second comb-shaped contact 118 are simultaneously formed in the ILD layer 112 above the device isolation structure 104, so that the second comb-shaped contact 118 and the first comb-shaped contact 116 are alternately formed in the same layer (the ILD layer 112) above the device isolation structure 104. In the present embodiment, the floating gate contact 114 is a single-layer structure, and the manufacturing process thereof with the first comb-shaped contact 116 and the second comb-shaped contact 118 is, for example, first forming a photoresist (not shown) on the surface of the ILD layer 112, then patterning this layer of photoresist to expose a portion of the ILD layer 112 (that is, the positions where the floating gate contact 114 and the first and second comb-shaped contacts 116 and 118 are to be formed), then removing the exposed ILD layer 112 by etching and forming an opening, then forming the floating gate contact 114, the first comb-shaped contact 116, and the second comb-shaped contact 118 in the opening, and a contact planarization process may be incorporated, wherein the contacts (114, 116, and 118) are, for example, Ti/TiN/W structures or other material structures, and a height h1 of the first comb-shaped contact 116 is about greater than a height h2 of the floating gate 106. Therefore, compared with a traditional device that uses a polysilicon layer as a floating gate or an extension part thereof, the space perpendicular to the substrate 100 direction may be fully utilized to significantly increase the capacitive coupling ratio of the first comb-shaped contact 116 and the second comb-shaped contact 118. Moreover, because the first comb-shaped contact 116 and the second comb-shaped contact 118 are formed above the device isolation structure 104, the first comb-shaped contact 116 and the second comb-shaped contact 118 are electrically connected to the floating gate 106 via a higher metal layer. In such a non-traditional structure, the electrical connection of the floating gate and the extension part thereof is completed after the etching of the floating gate and the extension part thereof. Therefore, the gate insulating layer 110 under the floating gate 106/the select gate 108 is not damaged due to the plasma process, and the yield and reliability of subsequent products are not affected.

Figure 1D:
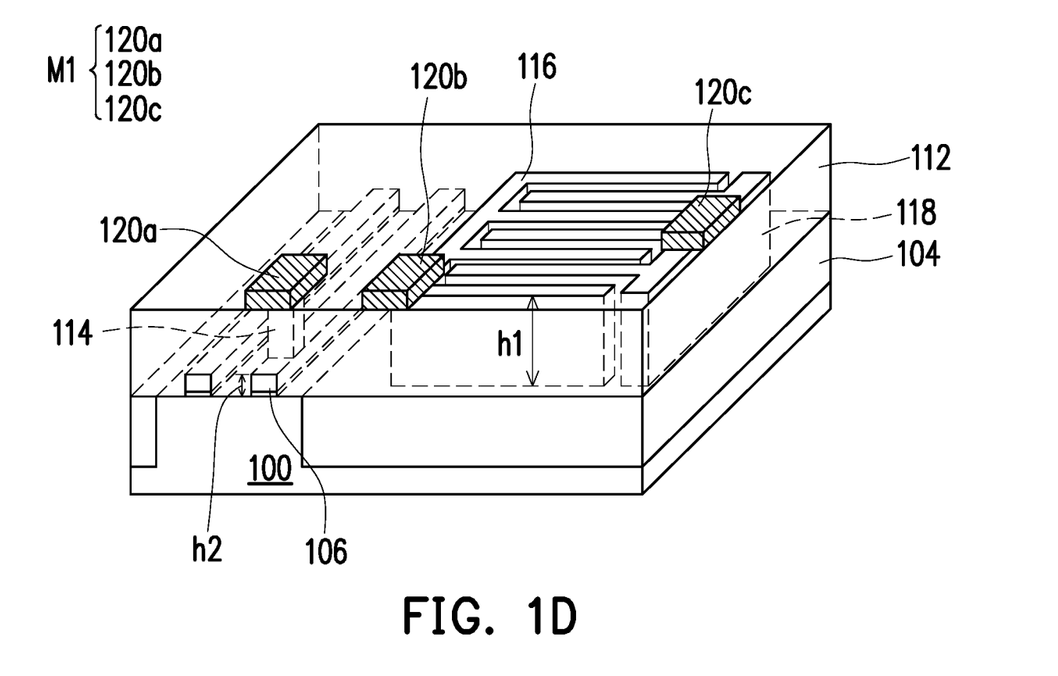

Then, referring to FIG. 1D, an interconnect structure is formed on the ILD layer 112. For example, a first metal layer M1 is formed first, and the process thereof may be first depositing a metal material (not shown) on the surface of the ILD layer 112, and then patterning the metal material (such as aluminum) by photolithography to obtain metal circuits 120a, 120b, and 120c respectively connected to the floating gate contact 114, the first comb-shaped contact 116, and the second comb-shaped contact 118.

Figure 1E:
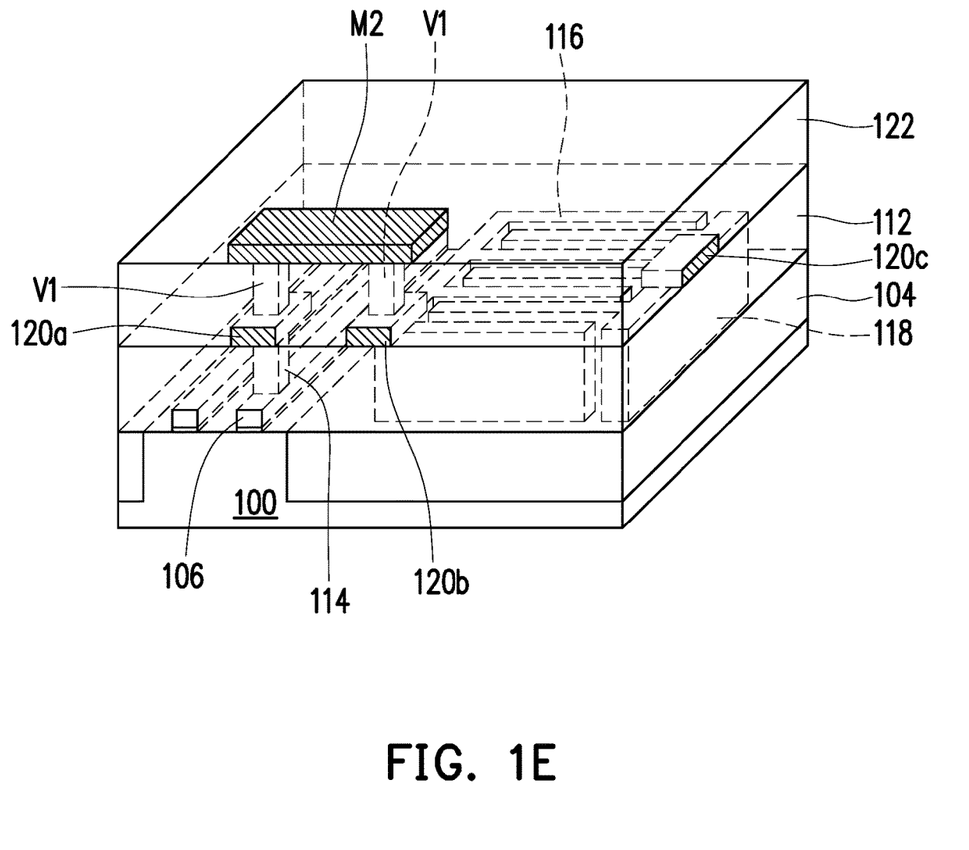

Then, referring to FIG. 1E, a first inter metal dielectric (IMD) layer 122 is formed on the IMD layer 112, and then first vias V1 are formed in the first IMD layer 122, wherein one first via V1 is in contact with the metal circuit 120a, and the other first via V1 is in contact with the metal circuit 120b. Then, a second metal layer M2 connected to the first vias V1 is formed on the first IMD layer 122. The manufacturing process and structure of the first vias V1 are as provided in the related content of the floating gate contact 114, and the manufacturing process of the second metal layer M2 is as provided in the related content of the first metal layer M1, and are not repeated herein.

In the first embodiment, the first comb-shaped contact 116 and the second comb-shaped contact 118 are formed in the ILD layer 112, but the invention is not limited thereto. In other embodiments, the first comb-shaped contact 116 and the second comb-shaped contact 118 may be formed in the first IMD layer 122 or a subsequent IMD layer formed thereon, or may be formed in the ILD layer 112 and the IMD layer simultaneously. Moreover, if the first comb-shaped contact 116 and the second comb-shaped contact 118 are regarded as a pair of complementary conductive structures, the quantity thereof may also be increased as needed and the first comb-shaped contact 116 and the second comb-shaped contact 118 may be disposed in a plurality of IMD layers. The first comb-shaped contact 116 is used as a floating gate extension part, and the second comb-shaped contact 118 is used as a control gate. Therefore, the floating gate extension part (116) may be electrically connected to the floating gate contact 114 via an interconnect structure (the metal circuit 120b, the first via V1, the second metal layer M2, the first via V1, the metal circuit 120a). Similarly, although the connection path of the second comb-shaped contact 118 is not shown in FIG. 1E, it should be understood that the first vias and the second metal layer connected to the metal circuit 120c may be formed at this stage to be connected to the peripheral area.

Figure 2A:
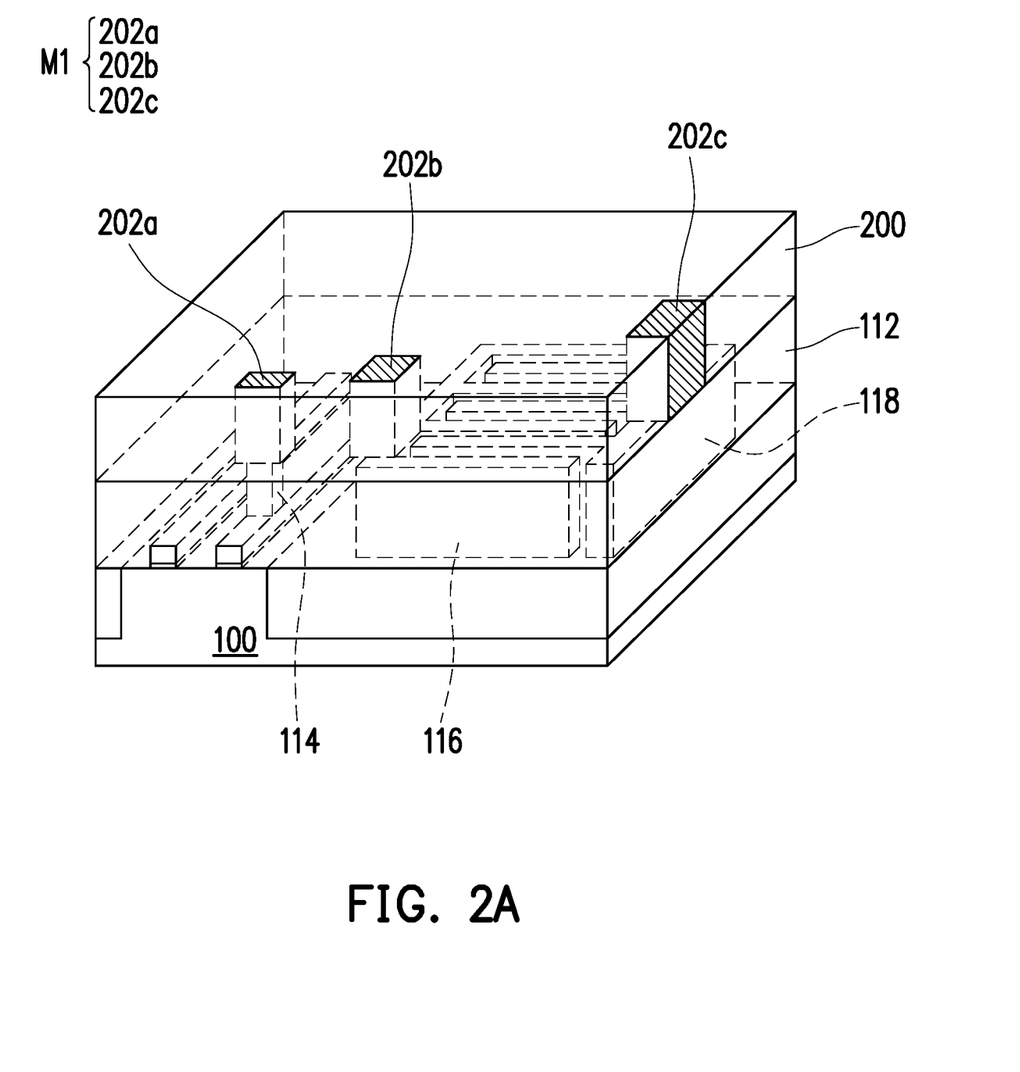
FIG. 2A to FIG. 2B are diagrams of an alternative example of the manufacturing process of the first embodiment.
Figure 2B:
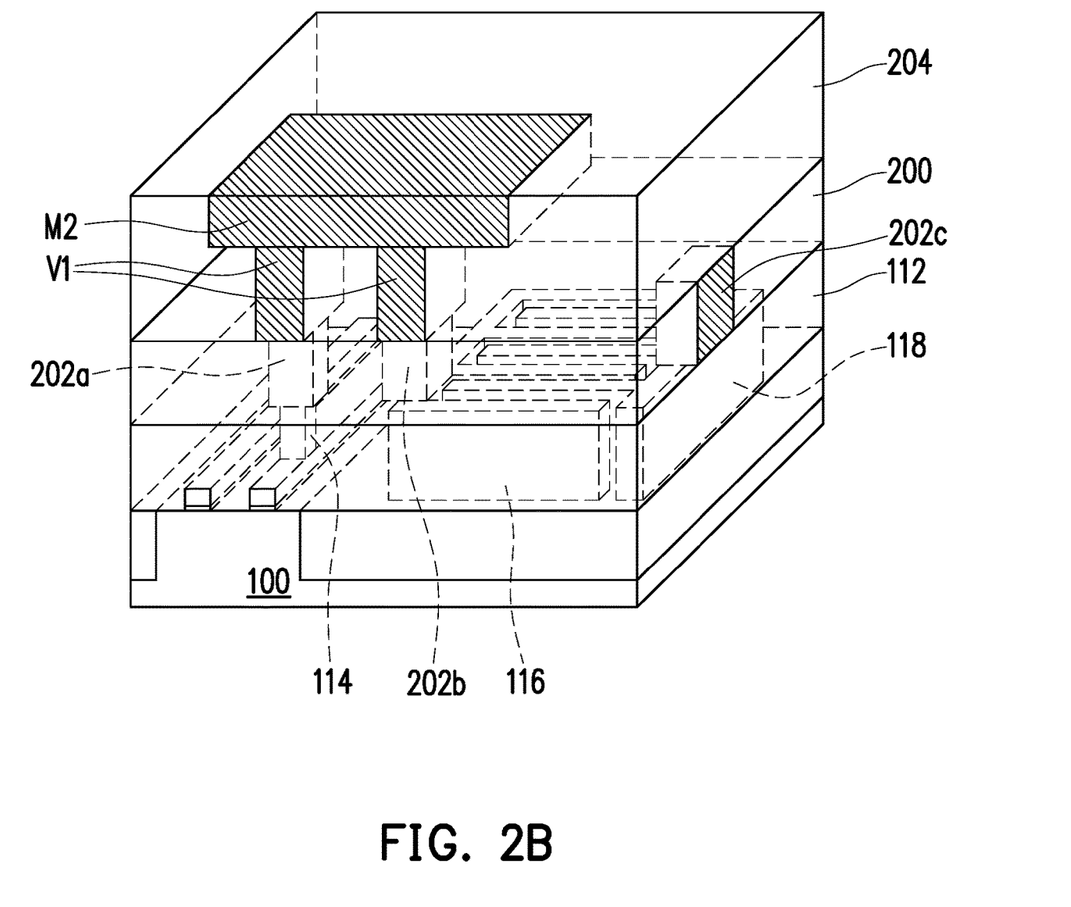

FIG. 2A to FIG. 2B are diagrams of an alternative example of the manufacturing process of the first embodiment that show the steps after FIG. 1C.

In FIG. 2A, a first layer 200 is deposited first, and then a trench for forming the first metal layer M1 is formed by etching, then a layer of metal material (such as copper) is deposited into the trench using, for example, physical vapor deposition (PVD) or electrochemical deposition (ECD), and then the metal material is planarized by a metal chemical mechanical polishing (CMP) process to form metal circuits 202a, 202b, and 202c in FIG. 2A.

Then, FIG. 2B shows the interconnection formed by a dual damascene process. That is, a second IMD layer 204 is deposited first, and then an opening for forming the first vias V1 is formed therein by etching, and then a trench for forming the second metal layer M2 is formed by etching in the second IMD layer 204, wherein the trench is located above the opening. Then, a layer of metal material (such as copper) is deposited into the trench and the opening using, for example, PVD or ECD, and then the metal material is planarized using a metal CMP process to simultaneously form the first vias V1 and the second metal layer M2.

Therefore, the interconnect structure of FIG. 2B is similar to that of FIG. 1E where both may be electrically connected to the floating gate extension part 116 via an interconnect structure (the metal circuit 202b, the first via V1, the second metal layer M2, the first via V1, the metal circuit 202a) to the floating gate contact 114. Similarly, although the connection path of the second comb-shaped contact 118 is not shown in FIG. 2B, it should be understood that the first vias and the second metal layer connected to the metal circuit 202c may be formed at this stage to be connected to the peripheral area.

Figure 2C:
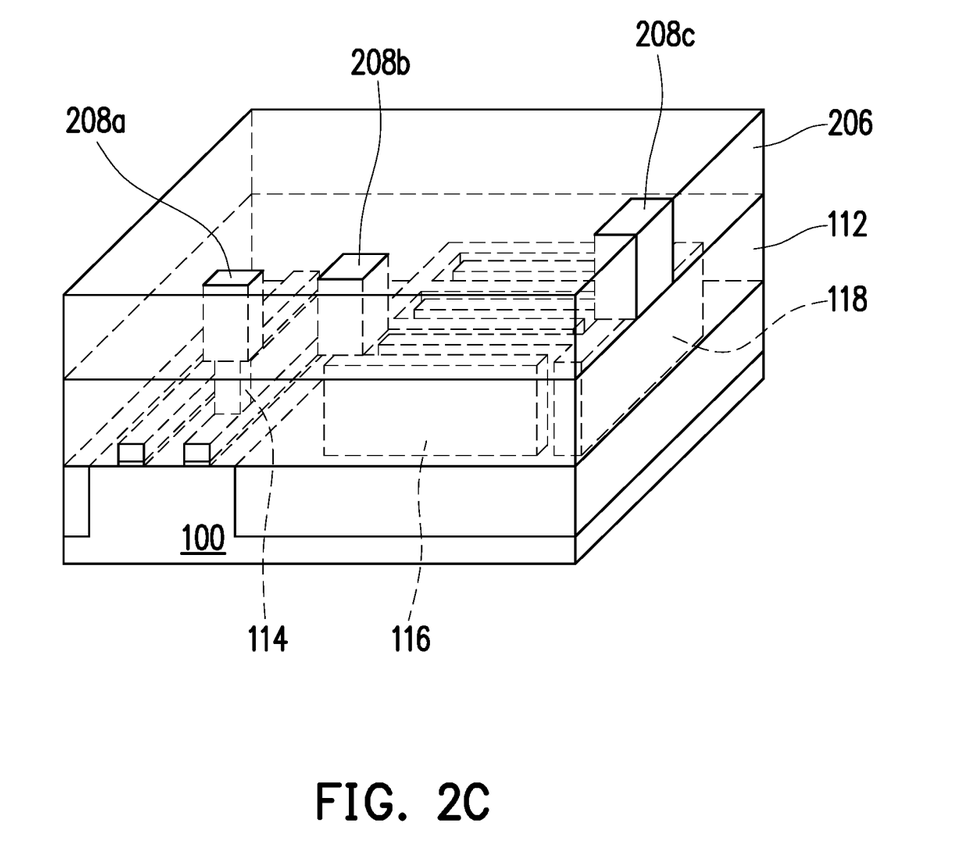
FIG. 2C is a diagram of another alternative example of the manufacturing process of the first embodiment.

FIG. 2C is a diagram of another alternative example of the manufacturing process of the first embodiment that show the steps after FIG. 1C.

In FIG. 2C, the floating gate contact 114 may be regarded as a multi-layer structure. That is, after the floating gate contact 114 is formed, a dielectric layer 206 is deposited on the floating gate contact 114 first and then a contact 208a for local connection is formed. During the forming of the contact 208a, a contact 208b and a contact 208c may be formed on the first comb-shaped contact 116 and the second comb-shaped contact 118. The manufacturing process and structure of the contacts 208a, 208b, and 208c are as provided in the related content of the floating gate contact 114 and are not repeated herein. The subsequent manufacturing process is shown in FIG. 1D to FIG. 1E.

Figure 3:
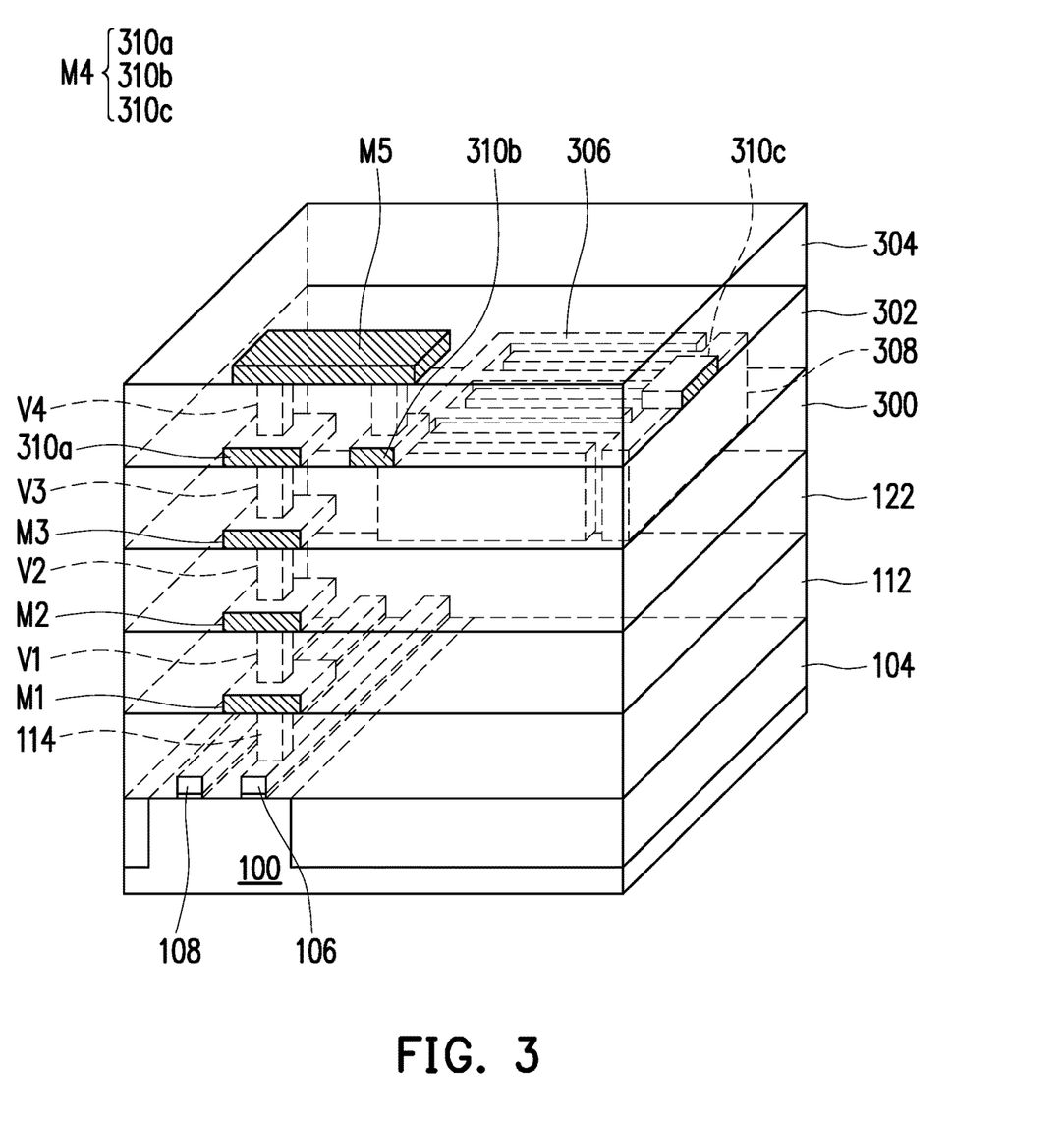
FIG. 3 is a diagram of a non-volatile memory device according to the second embodiment of the invention.

FIG. 3 is a diagram of a non-volatile memory device according to the second embodiment of the invention, wherein the reference numerals of the first embodiment are used to indicate the same or similar components, and the descriptions of the same components are as provided in the above related content and are not repeated herein.

Referring to FIG. 3, the interconnect structure in the non-volatile memory device of the second embodiment includes a plurality of metal layers M1, M2, M3, M4, M5 and a plurality of inter metal dielectric (IMD) layers 122, 300, 302, 304 that are alternately stacked and a plurality of vias V1, V2, V3, V4 connecting upper and lower metal layers. In the present embodiment, a first comb-shaped contact 306 and a second comb-shaped contact 308 are formed in the IMD layer 302 and are connected to the second comb-shaped contact 308 via a metal circuit 310c in the metal layer M4. The first comb-shaped contact 306 is electrically connected to the floating gate contact 114 via an interconnect structure (a metal circuit 310b, the via V4, the metal layer M5, the via V4, a metal circuit 310a, the via V3, the metal layer M3, the via 12, the metal layer M2, the via V1, the metal layer M1).

Figure 4:
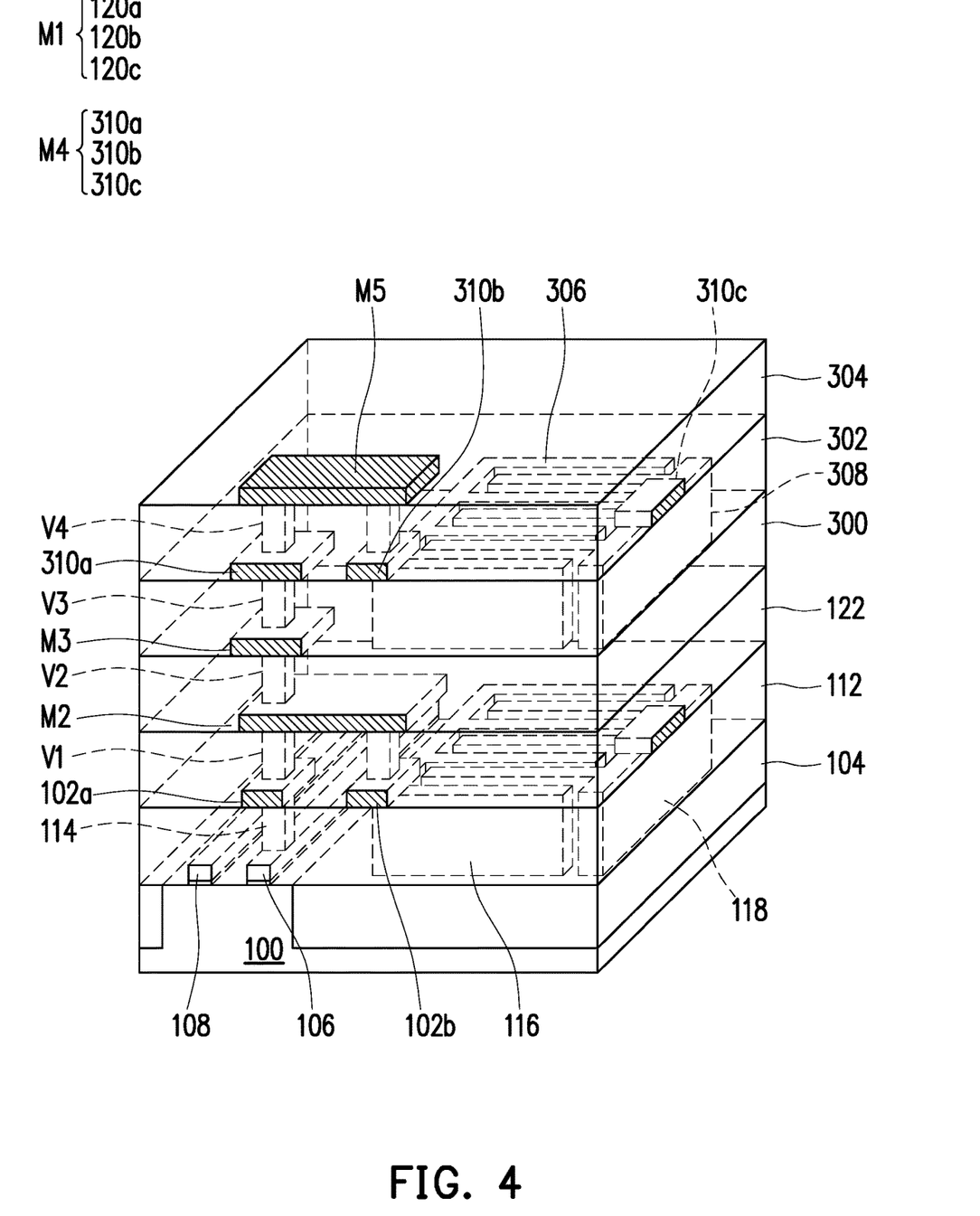
FIG. 4 is a diagram of a non-volatile memory device according to the third embodiment of the invention.

FIG. 4 is a diagram of a non-volatile memory device according to the third embodiment of the invention, wherein the reference numerals of the first and second embodiments are used to indicate the same or similar components, and the descriptions of the same components are as provided in the above related content and are not repeated herein.

Referring to FIG. 4, the non-volatile memory device of the third embodiment has the two first comb-shaped contacts 116 and 306 as floating gate extension parts, and the two second comb-shaped contacts 118 and 308 as control gates. Furthermore, the floating gate extension parts 116 and 306 are electrically connected to the floating gate contact 114 via an interconnect structure. In the same way, although the connection paths of the second comb-shaped contacts 118 and 308 are not shown in FIG. 4, it should be understood that a structure connecting the metal circuits 120c and 310c may be formed in the interconnect structure.

Figure 5A:
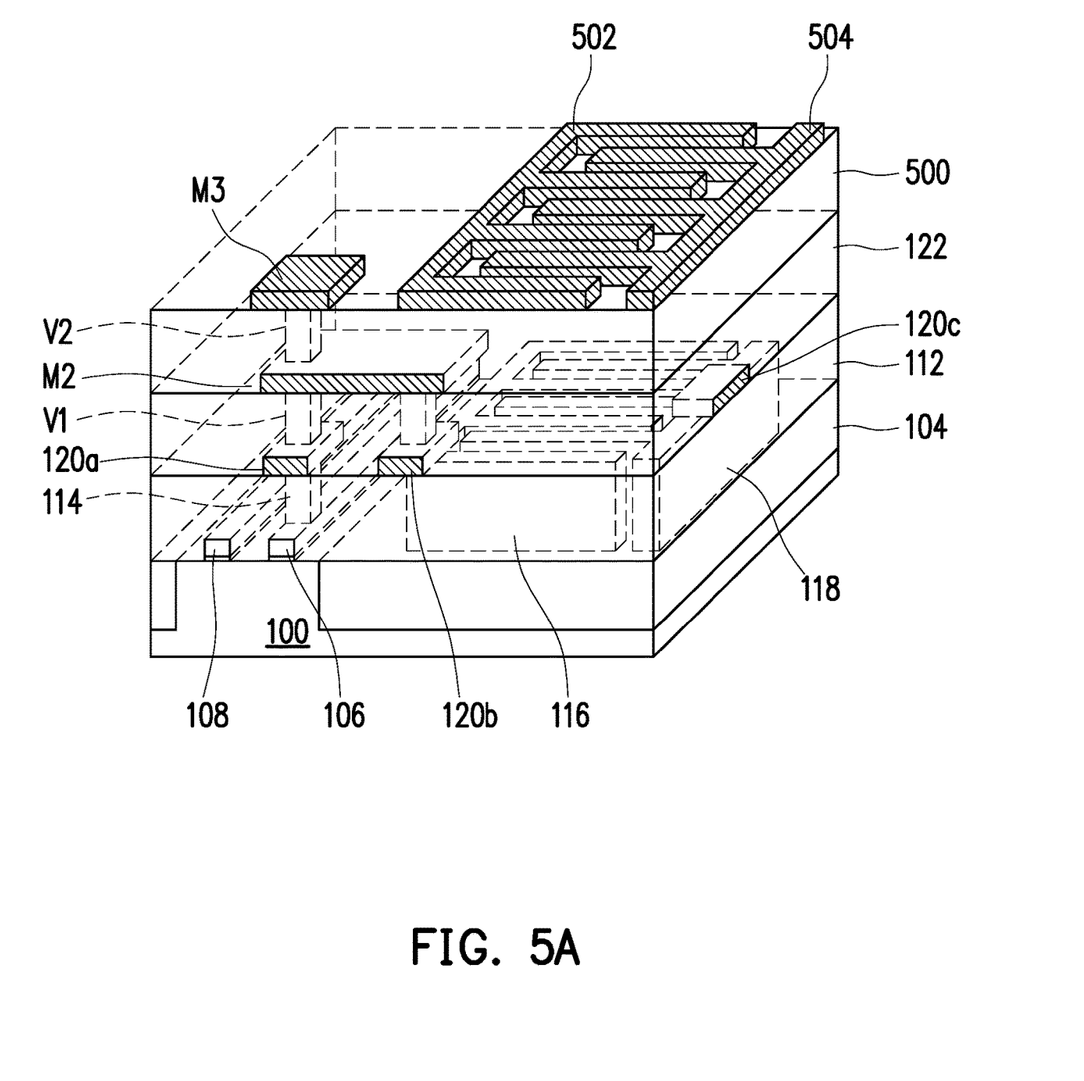
FIG. 5A to FIG. 5B are diagrams of a manufacturing process of a non-volatile memory device according to the fourth embodiment of the invention.
Figure 5B:
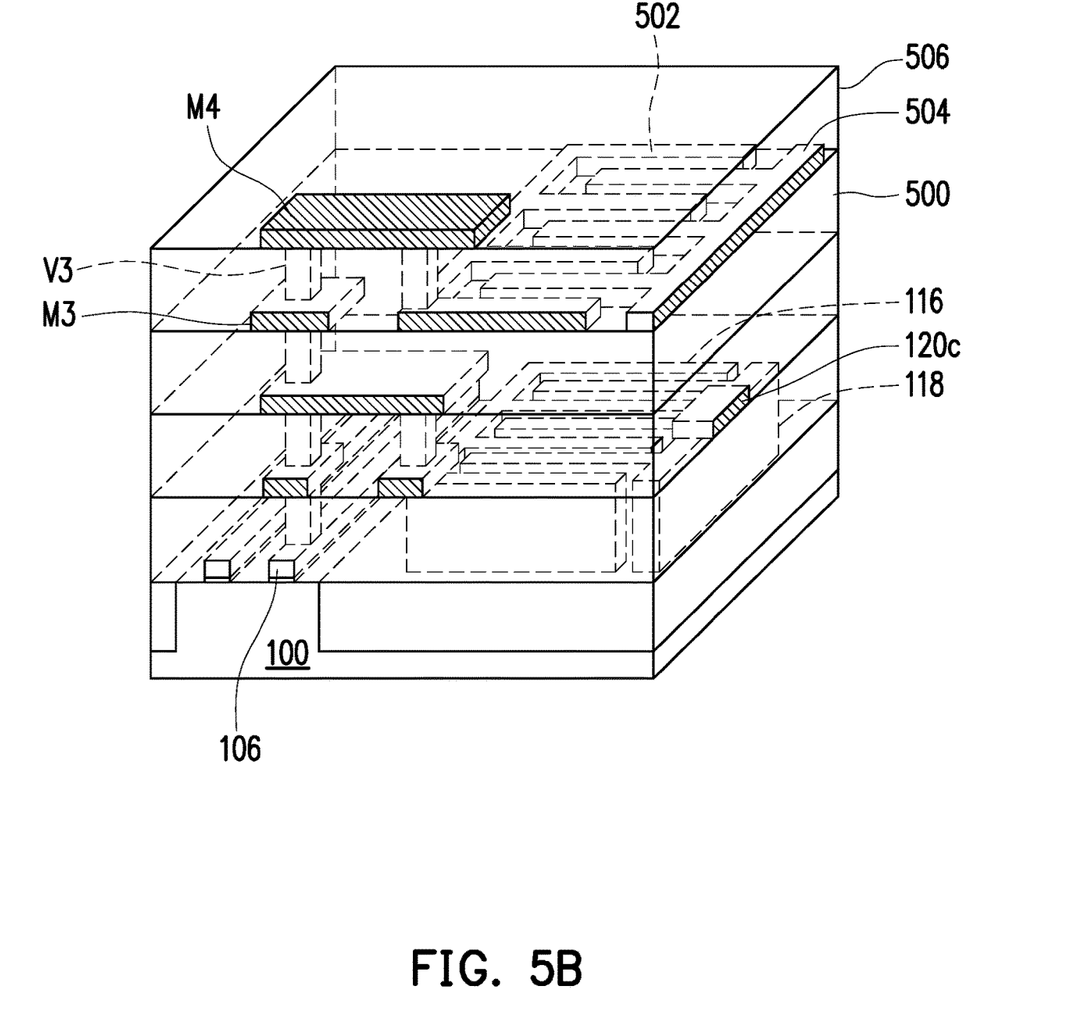

FIG. 5A to FIG. 5B are diagrams of a manufacturing process of a non-volatile memory device according to the fourth embodiment of the invention, wherein the reference numerals of the first embodiment are used to indicate the same or similar components, and the descriptions of the same components are as provided in the above related content and are not repeated herein.

First. FIG. 5A shows the steps following FIG. 1E. Then, a second IMD layer 500 is formed on the first IMD layer 122, and then a second via V2 is formed in the second IMD layer 500, wherein the second via V2 and the second metal layer M2 are in contact. The manufacturing process of the second via V2 is as provided in the related content of the floating gate contact 114 and is not repeated herein. Then, the third metal layer M3 is formed on the second IMD layer 500, and a first comb-shaped metal structure 502 and a second comb-shaped metal structure 504 are simultaneously formed. The manufacturing process thereof is, for example, first depositing a metal material (not shown) on the surface of the second IMD layer 500, and then patterning the metal material by photolithography to obtain the metal layer M3, the first comb-shaped metal structure 502, and the second comb-shaped metal structure 504 that are not connected to each other. Since the first comb-shaped metal structure 502 is electrically connected to the floating gate extension part 116 via an upper conductive line, the antenna effect in the etching process may be prevented from damaging the structure of the gate insulating layer 110, thereby improving product yield and reliability.

Then, referring to FIG. 5B, a third IMD layer 506 is formed on the second IMD layer 500, and then the third vias V3 are formed in the third IMD layer 506, wherein one via V3 is in contact with the third metal layer M3, and the other via V3 is in contact with the first comb-shaped metal structure 502. Then, a fourth metal layer M4 connected to the two vias V3 is formed on the third IMD layer 506. Therefore, the first comb-shaped metal structure 502 may be electrically connected to the floating gate extension part (116) and/or the floating gate 106 via an interconnect structure. Similarly, although the connection path of the second comb-shaped metal structure 504 is not shown in FIG. 5B, it should be known that a structure connected to the second comb-shaped metal structure 504 and the second comb-shaped contact 118 may be formed in an interconnect structure. In addition, the manufacturing process and structure of the vias V3 are as provided in the related content of the floating gate contact 114 and are not repeated herein.

In the present embodiment, the first comb-shaped metal structure 502 and the second comb-shaped metal structure 504 are formed in the third IMD layer 506, but the invention is not limited thereto. The first and second comb-shaped metal structures may also be formed in other IMD layers, and the quantity thereof may be increased as needed.

Based on the above, in the invention, during the manufacture of the first and second comb-shaped contacts, because the large area first and second comb-shaped contacts are electrically isolated from the floating gate, the gate insulating layer under the floating gate is not damaged by the plasma process. In addition, the first comb-shaped contact may be connected to the floating gate via the interconnect process of the upper layer, without additional steps. Moreover, because the height of the comb-shaped contact is significantly greater than the thickness of the floating gate, a device in which the first comb-shaped contact is used as the floating gate extension part and the other comb-shaped contact is used as the control gate may significantly increase the voltage coupling ratio between the floating gate and the control gate, thereby improving the programming/erasing, efficiency of the device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method for manufacturing a non-volatile memory device, comprising:

forming a device isolation structure defining an active area in a substrate;

forming a floating gate on the substrate in the active area;

forming an inner layer dielectric (ILD) layer on the substrate to cover the floating gate and the device isolation structure;

forming a floating gate contact in the ILD layer to contact the floating gate; and forming an interconnect structure on the ILD layer, wherein the interconnect structure comprises a plurality of metal layers and a plurality of inter metal dielectric (IMD) layers that are alternately stacked and a plurality of vias connecting upper and lower metal layers, wherein in the manufacturing method:

after the ILD layer is formed, a first comb-shaped contact and a second comb-shaped contact are simultaneously formed in at least one of the ILD layer and the IMD layers above the device isolation structure, wherein the first comb-shaped contact is a floating gate extension part, and the second comb-shaped contact is a control gate; and during the forming of the interconnect structure, a structure is simultaneously formed for electrically connecting the floating gate extension part to the floating gate contact.

2. The method for manufacturing the non-volatile memory device of claim 1, wherein the first comb-shaped contact and the second comb-shaped contact are formed simultaneously with the floating gate contact.

3. The method for manufacturing the non-volatile memory device of claim 1, wherein the first comb-shaped contact and the second comb-shaped contact are formed simultaneously with at least one of the plurality of vias.

4. The method for manufacturing the non-volatile memory device of claim 1, further comprising:

forming a first comb-shaped metal structure and a second comb-shaped metal structure in at least one of the plurality of IMD layers; and forming a structure electrically connected to the floating gate extension part and the first comb-shaped metal structure, and forming a structure electrically connected to the control gate and the second comb-shaped metal structure during the forming of the interconnect structure.

5. The method for manufacturing the non-volatile memory device of claim 1, wherein the step of forming the floating gate further comprises: forming a select gate disposed in parallel with the floating gate in the active area, wherein the select gate is an N-type or P-type metal oxide semiconductor-transistor for selecting a specified memory address in a memory array when performing reading, erasing, or programming.

* * * * *